United States Patent
Lile

(10) Patent No.: US 12,177,640 B2
(45) Date of Patent: Dec. 24, 2024

(54) AMPLIFIER-SPEAKER SELECTOR FOR MUSICAL INSTRUMENTS

(71) Applicant: De Lisle Guitar Company LLC, Zionsville, IN (US)

(72) Inventor: Jeremy D. Lile, Zionsville, IN (US)

(73) Assignee: De Lisle Guitar Company LLC, Zionsville, IN (US)

( * ) Notice: Subject to any disclaimer, the term of this patent is extended or adjusted under 35 U.S.C. 154(b) by 286 days.

(21) Appl. No.: 17/662,352

(22) Filed: May 6, 2022

(65) Prior Publication Data

US 2022/0360900 A1 Nov. 10, 2022

Related U.S. Application Data

(60) Provisional application No. 63/184,826, filed on May 6, 2021.

(51) Int. Cl.
| | |
|---|---|
| H04R 5/04 | (2006.01) |
| H03F 1/52 | (2006.01) |
| H03F 1/56 | (2006.01) |
| H04R 3/12 | (2006.01) |

(52) U.S. Cl.
CPC .............. *H04R 5/04* (2013.01); *H03F 1/52* (2013.01); *H03F 1/56* (2013.01); *H04R 3/12* (2013.01); *H03F 2200/03* (2013.01)

(58) Field of Classification Search
CPC .... H04R 5/04; H04R 3/12; H03F 1/52; H03F 1/56; H03F 2200/03
See application file for complete search history.

(56) References Cited

U.S. PATENT DOCUMENTS

| | | | |
|---|---|---|---|
| 4,143,245 | A | 3/1979 | Scholz |
| 5,761,316 | A | 6/1998 | Pritchard |
| 6,111,961 | A | 8/2000 | Hedrick et al. |
| 6,610,917 | B2 | 8/2003 | Ludwig |
| 6,631,195 | B1 | 10/2003 | Pritchard |
| 7,201,251 | B1 | 4/2007 | Baird |
| 7,894,615 | B1 | 2/2011 | McKiel, Jr. |
| 8,848,944 | B1 | 9/2014 | Civiletti |
| 9,508,332 | B2 | 11/2016 | Scott |

(Continued)

OTHER PUBLICATIONS

8×4 Amp/Speaker Selector. Kahayan Proaudio [online], [retrieved on Aug. 4, 2022]. Retrieved from the Internet <URL:https://www.kahayan.es/selector-8x4>.

(Continued)

*Primary Examiner* — Andrew Sniezek
(74) *Attorney, Agent, or Firm* — Woodard, Emhardt, Henry, Reeves & Wagner, LLP

(57) ABSTRACT

An audio signal switching device is configured to route a source signal to one of multiple connected amplifiers and or more connected speakers in accordance with user-selected parameters. Unselected amplifiers may be muted at their inputs and have outputs switched to a protective load. The device may include connections to route an amplified signal through external effects loops and/or bypass such loops. The device may include a bypassable signal attenuator between the selected amplifier's output and a selected speaker. Systems and methods of using such devices and processing signals in accordance with the disclosure are also disclosed.

20 Claims, 6 Drawing Sheets

(56) References Cited

U.S. PATENT DOCUMENTS

| | | | |
|---|---|---|---|
| 10,178,466 B2 | 1/2019 | Notzel | |
| 10,425,755 B2 | 9/2019 | Nishikori et al. | |
| 2009/0007763 A1* | 1/2009 | Steele | G10H 3/146 |
| | | | 84/746 |
| 2016/0301488 A1* | 10/2016 | Tillman | H04H 60/58 |

OTHER PUBLICATIONS

ACS 4×4 FX. KHE Audio Electronics [online], [retrieved on Aug. 4, 2022]. Retrieved from the Internet <URL:https://www.khe-audioelectronics.com/shop/acs-4x4-fx>.

Ampete 88S-Studio. Ampete Engineering [online], [retrieved on Aug. 4, 2022]. Retrieved from the Internet <URL:https://www.ampete-engineering.com/products/switcher-series/ampete-88s-studio/>.

Switcher Series / 444. Ampete Engineering [online], [retrieved on Aug. 4, 2022]. Retrieved from the Internet <URL:https://www.ampete-engineering.com/product/444/>.

KHE Audio Electronics, Amplifier Cabinet Selector ACS—Series User Manual, May, 8, 2020.†

Tone King Amplifier Company, Ironman II Precision Compensated Reactivate Power Attenuator, 2018.†

"KHE Amp Swilchera—new productline-up and realures," pp. 1-10, May 23, 2020, Rig Talk Forum, htlps:l/www rig-l.elk com/forum/lh19dii/khe-amp-cab-swilchera-new-produc\-line-up-and-fealures 210907/.†

FSGebook posl: "The new KHE ACS 4×4 FX—The ultimate amp switcher pecked wlihfealures in a single reckspaca uni11," 1 pege, Mey 25, 2020, Mets Plaltt>rms Inc, https://www facebookcom/KHEAudioEleciron 0 D.†

KHE Audio ElectmnlCII, Facebook poslenlilled:"Anlce rack wilh KHE B×B FX ampcsb switching syslem!", one page, Dec. 16, 2020,Mela Platforms, Inc, ,iq:il'r1-'":7'1""'9.†

KHE Audio Electronics, Face book pas I enlllied:"Rig-rundown ol my current office sel up," one page, Mey 23, 2020, Mela Platf011TI9, Inc https:/fwww.facebook.com/seardl/posts?q=khe%20audio%20electrn.†

Pablo Kahayan, BX4 Midi Selector 8 Amplifiers/ 4 Speaker Selector Operator's Manual, pp. 1-17, 2017, Kahayan Audio.†

\* cited by examiner
† cited by third party

AMPLIFIER-SPEAKER SELECTOR FOR MUSICAL INSTRUMENTS

CROSS-REFERENCE TO RELATED APPLICATIONS

This application claims the benefit of U.S. Provisional Application No. 63/184,826 filed May 6, 2021, which is hereby incorporated by reference.

BACKGROUND OF THE INVENTION

Audio signal connections are important components in sound recording, reproduction, or live performance. In a studio environment, many audio signal paths must be patched by hand and changed frequently. For example, if a guitar player wants a certain sound, she will plug into the input of an amplifier, connect the desired speaker cabinet to the amplifier's output, and connect any external effects processing to the amplifier's effects loop. If signal attenuation is desired, then additional connections must be made between the amplifier's output and the speaker cabinet. If any of these components in the signal path needs to be changed to achieve a different sound, then it requires re-cabling and pathing in the new device.

Multiple amplifier and cabinet switching devices are commercially available. However, these devices do not provide complete solutions. For example, it may be desirable to attenuate a signal from an amplifier prior to sending the signal to a speaker so that the volume of the sound is reduced without sacrificing the tonal qualities imparted by the amplifier. A further complication is that amplifiers may operate at a specified impedance, for example 8 ohms, while a speaker or speaker cabinet may be configured for a different impedance, such as 4 ohms or 16 ohms. Mismatching the impedance between the amplifier and the cabinet may negatively impact sound quality and/or damage equipment. Known devices do not sufficiently integrate attenuation solutions with multiple amplifier and cabinet switching and do not account for impedance mismatching between selected amplifiers and cabinets.

Therefore, it may be advantageous to provide an audio signal switching device that can route an instrument sound source to any combination of connected amplifiers, speakers, attenuators, and effects without the need to reconfigure plugs and cabling. The present disclosure relates to audio signal switching devices and methods useful to solve these problems, especially for electric musical instruments such as guitars and basses.

SUMMARY

In one aspect, the disclosure relates to a multiple amplification selector device for processing an audio source such as an instrument source signal having multiple amplifier send and return jacks and an amplifier switching circuit configured to route the source signal to a selected amplifier and switch unselected amplifiers to a protective load. The apparatus may include an internal attenuation device which is optionally selected or bypassed. The device is configured to send amplified and/or attenuated signal to one or more selected speakers. Embodiments include optional additional user-selectable jacks for inserting external processing devices into a signal chain. For example, an external effects loop can be implemented with corresponding effects send and return jacks for connecting the selector apparatus's effects loop into the signal path of the selected amplifier. The device may include jacks for connecting an external attenuation device and appropriate switching capability to either select or bypass routing an amplified signal to such an external attenuation device.

The disclosure extends to methods of using such devices and methods of signal processing in accordance with the devices and structures described herein. For example, methods include receiving an instrument input signal, sending the instrument input signal to an amplifier selected by an amplifier selector, receiving an amplified signal from the selected amplifier, sending the amplified signal to an attenuator selection circuit, and sending an attenuated signal to a selected speaker. Additional steps may include sending a signal to an external effects loop and inserting the return signal from that loop into the signal chain of a selected amplifier.

Further forms, objects, features, aspects, benefits, advantages, and embodiments will become apparent from a detailed description and drawings provided herewith.

DETAILED DESCRIPTION

Figure 1:
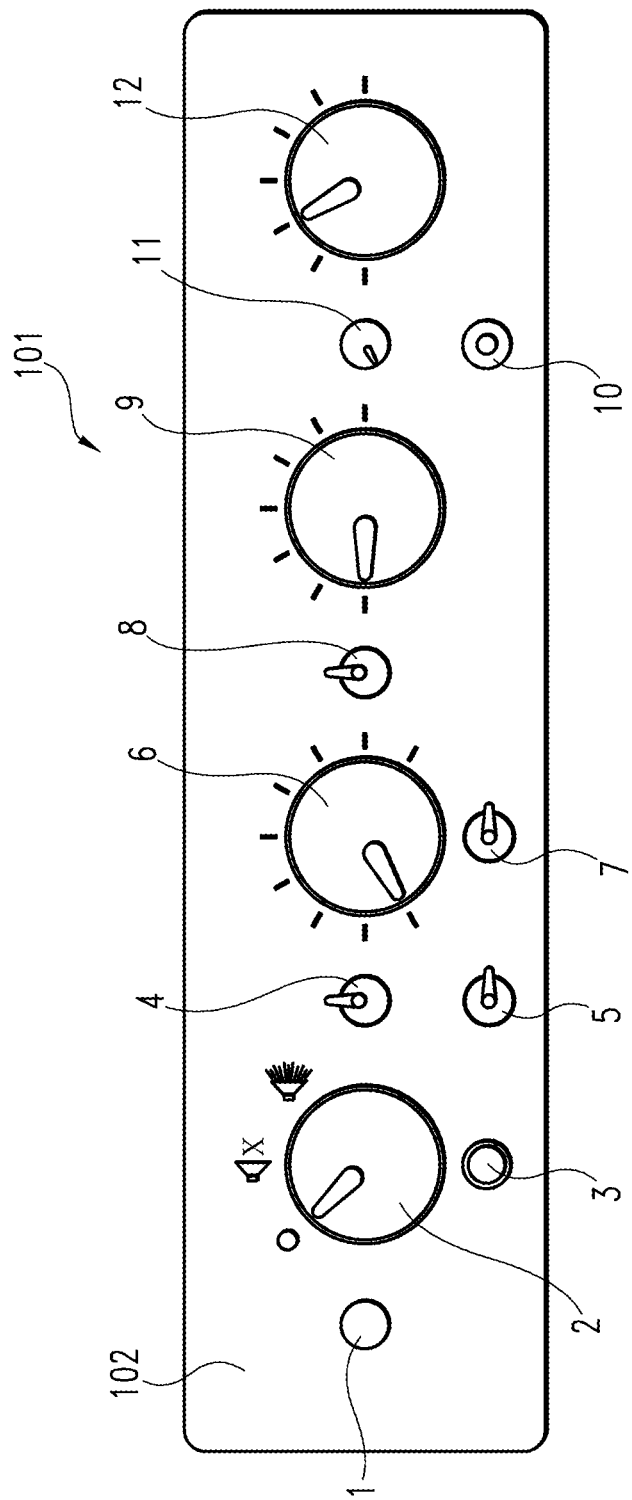
FIG. 1 is a front panel view of a multiple amplification selector device in accordance with one embodiment of the disclosure.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Certain embodiments of the invention are shown in great detail, although it will be apparent to those skilled in the relevant art that some features that are not relevant to the present disclosure may not be shown for the sake of clarity, and it will be further apparent that features of the embodiments may be combined, transferred, or rearranged without departing from the scope of the disclosure.

FIG. 1 shows the front panel 102 of a multiple amplifier and speaker selector device 101. The device includes an input jack 1 preferably configured as a standard ¼" instrument or audio cable for receiving an audio signal such as an instrument source signal. Such instrument signals are commonly provided by electric guitars and basses, but may be generated by other instruments such as keyboards, synthesizers, electronic drum modules, samplers, and the like. Processing of other audio signals, such as vocals or other acoustic sounds captured by microphones are within the scope of the disclosure and may be provided as the input audio signal to the device 101 through input jack 1. The device may include a power switch 2 and power indicator 3. As illustrated in FIG. 1, power switch 2 has three positions: off, mute/standby, and on. Power indicator 3 is preferably a LED or other light source which emits light when the device 101 is receiving power, i.e., when the power switch 2 is in either of the mute/standby or on positions.

Panel 102 may include an effects loop bypass switch 4 and optionally an effects loop ground switch 5. When the effects loop bypass switch 4 is in the on position, audio signals will be routed to an effects loop which may be placed in the signal path of a selected amplifier as described further below. Effects loop ground switch 5 can be activated to interrupt the ground loops in a signal path and reduce noise arising from audio cabling among multiple connected devices.

Amplifier selector 6 is operably connected to an amplifier switching circuit (see FIG. 4 and description below) to provide for selection of one from the multiple amplifiers which may be connected to the device 101. As shown in FIG. 1, amplifier selector 6 is a rotary switch, but other selector types may be implemented, for example toggle switches, buttons, or other electromechanical switches. Amplifier selector 6 is shown with eight positions corresponding to eight amplifiers which may be connected to the device 101. However, it is understood that devices may be implemented with a different number of amplifier connections and positions for the amplifier selector 6, for example the device may be constructed to be compatible with selecting between 2, 3, 4, 5, 6, 7, 8, 9, 10, 11, 12, 13, 14, 15, or 16 or even more amplifiers. In some embodiments (not shown), amplifier selector 6 may be implemented through either wired or wireless remote control technologies known to those of skill in the art such as infrared, MIDI, Bluetooth, Ethernet, WiFi, software interfaces, mobile device applications, or foot pedals. Such remote control technologies may be implemented in addition to and/or in parallel to physical selector switch 6 shown in FIG. 6. Amplifier ground lift switch 7 may be included and, when activated, interrupt the ground loop as described above and known to persons of skill in this field.

Figure 4:
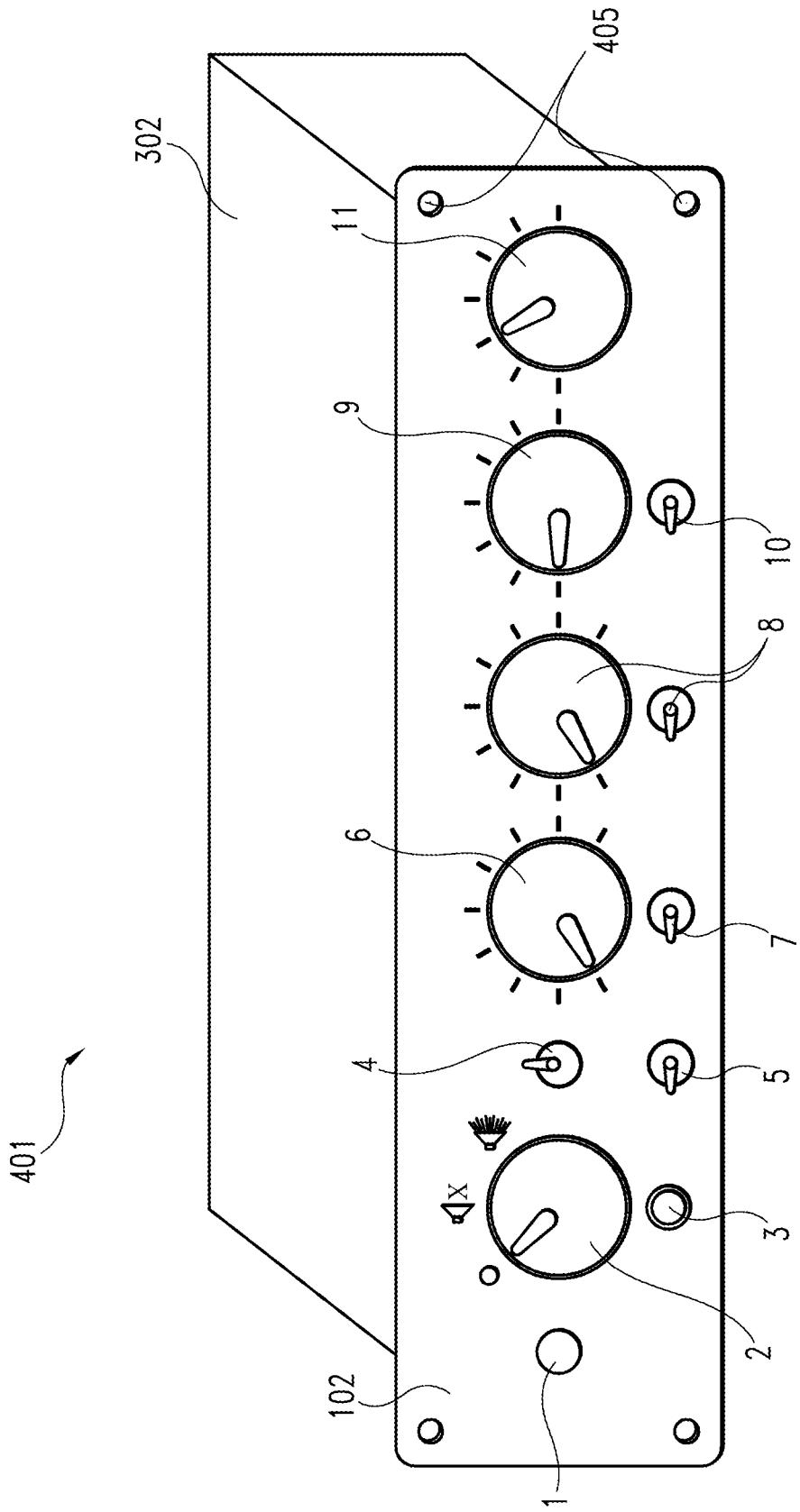
FIG. 4 is a perspective view of a multiple amplification selector device in an alternate housing configuration.

Attenuator selector 8 is operably connected to an attenuator switching circuit (again described further in connection with FIG. 4). Attenuator selector 8 is shown in FIG. 1 as a two-position toggle switch, bypass (down) or on (up), but again other types of switches may be implemented. For example, in one preferred embodiment, the device includes an internal attenuation device, and a two-position switch is suitable to either bypass or select the internal attenuation device. In another embodiment, the device may be equipped with optional jacks for sending and receiving signal to and from an external attenuation device. When both the internal attenuation device and the external attenuator loop feature are included, a three-position switch is desirable to permit a user to select either bypass, internal attenuator, or external attenuator. Attenuator selector 8 may also be integrated into an attenuator control, for example in connection with a rotary dial or potentiometer where the lowest setting is effectively bypassing the attenuator device. In such a dial, the initial segment of the turning radius switches the attenuator switching circuit out of bypass and into an active selection of the attenuator and then further rotation increases the level of attenuation provided by the attenuator device (i.e., reduces the power level of the output signal from an amplifier). Attenuator selector functions can also be integrated into remote control functionality as described above for the amplifier selector 6.

Preferably, internal attenuator device is a reactive attenuator. In a reactive attenuator, the output signal of the amplifier is lowered while maintaining the impedance curve such that the sound, tone, and response generated by a selected speaker is similar to, but at lower volume, that when the speaker is directly connected to the amplifier. As is known to a person of skill, other attenuator technologies may also be implemented, such as a resistive attenuator. The attenuation level may be subject to a linearly variable control, for example to provide attenuation in a range such as from −6 dB to −22.5 dB. The internal attenuation device may also be configured with a attenuation intensity, for example, to provide an attenuated signal at −6 dB, −10 dB, −16 dB, −20 dB relative to the amplified signal.

Returning to FIG. 1, speaker selector 9 is shown as rotary switch with six settings, although other types of switches including remote control technologies and different numbers of speaker settings such as 4, 6, 8, 10, 12, 14, or 16 or more speakers are within the scope of the disclosure. It is also understood that a single output may be directed to an individual speaker or to a speaker cabinet which may contain one or more than one speaker, such that referencing a "speaker" herein can be either a single speaker or a speaker cabinet. When a particular speaker path is selected with speaker selector 9, the output from the selected amplifier is routed (subject to any effects or attenuation loops) to a selected speaker jack. Optionally, multiple speakers may be selected for output. In FIG. 1, a parallel speaker switch 10 is included that can select for the output a first speaker group output controlled by speaker selector 9, a second speaker group output controlled by extension speaker selector 12, or both first speaker group and second speaker group in parallel.

The device 101 may also be implemented with a line out feature, and signal level on the line out jack may be controlled by a variable line out potentiometer 11. As with the effects loop and amplifier, the line out may also be equipped with a ground lift switch (not shown) for eliminating noise in the audio path. In some embodiments, line out can be configured as a transformer isolated direct input (D.I.) suitable for connecting to other equipment such as a recording console or an audio interface connected to a computer. The signal from the D.I. can then be subjected to further audio processing, either in a live setting or recorded playback, for example to apply additional effects or re-amplification. Line out and/or D.I. can also be used as a dry signal sent to a tuner.

Figure 2:
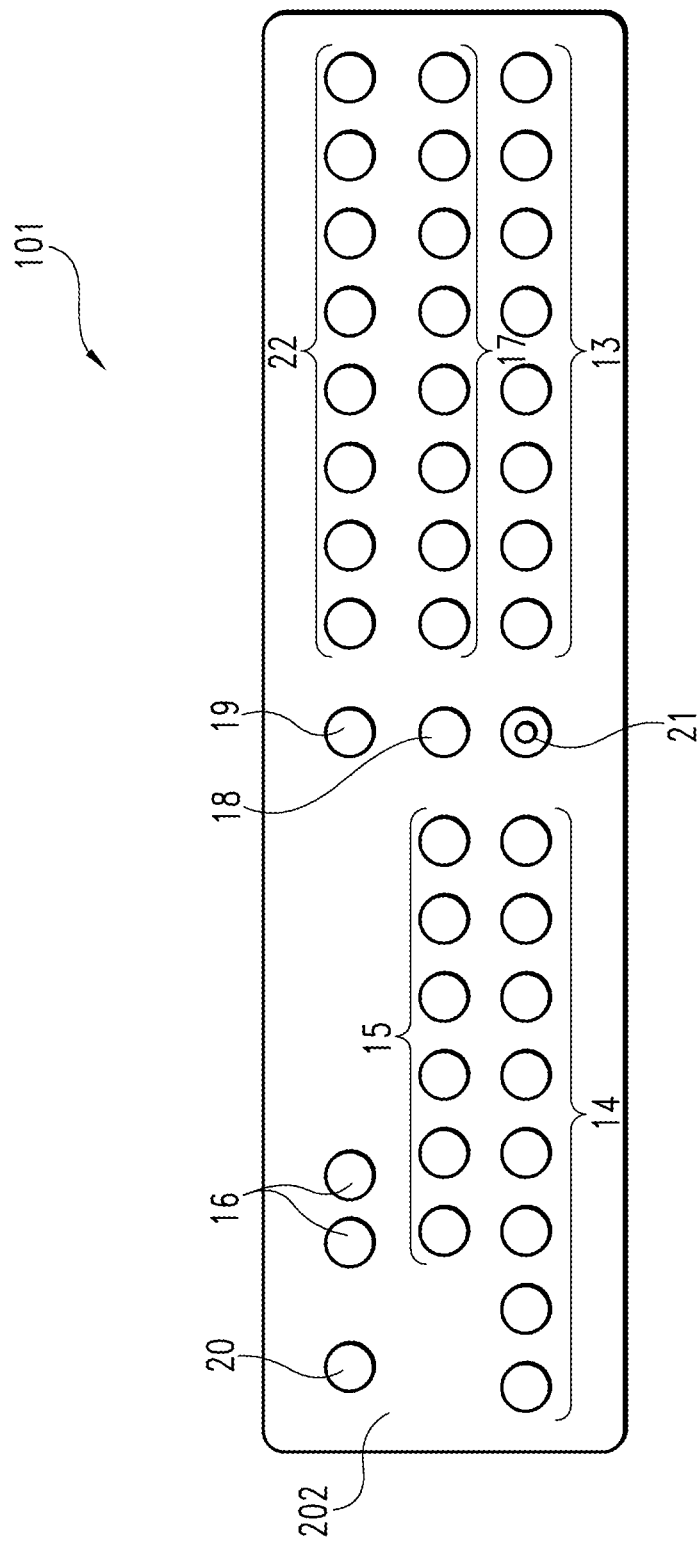
FIG. 2 is a rear panel view of the device of FIG. 1.

In FIG. 2, a rear panel 202 is shown for a multiple amplification selector device 101. Rear panel 202 includes a plurality of amplifier send jacks 13 and a corresponding number of amplifier return jacks 14, as well as a plurality of speaker send jacks 15. Jacks 13, 14, 15, etc. as shown in FIG. 2 are standard ¼" audio connections but it is understood that other formats of cables and connectors may be used in accordance with the teachings and embodiments discussed herein. Optionally, panel 202 may include external attenuator send and return jacks 16 and a number of amplifier effects loop send 17 and return connections 22 corresponding to the number of amplifier send 13 and return 14 jacks. The device 101 may include a master effects loop send jack 18 and master effects loop return jack 19. Optionally, a line level signal may be provided through line out jack 20. The panel also includes a power input 21. As shown and preferably, power input 21 may be a receptacle for a 9V DC center negative power supply as is common for guitar effects pedals and other audio equipment.

Figure 3:
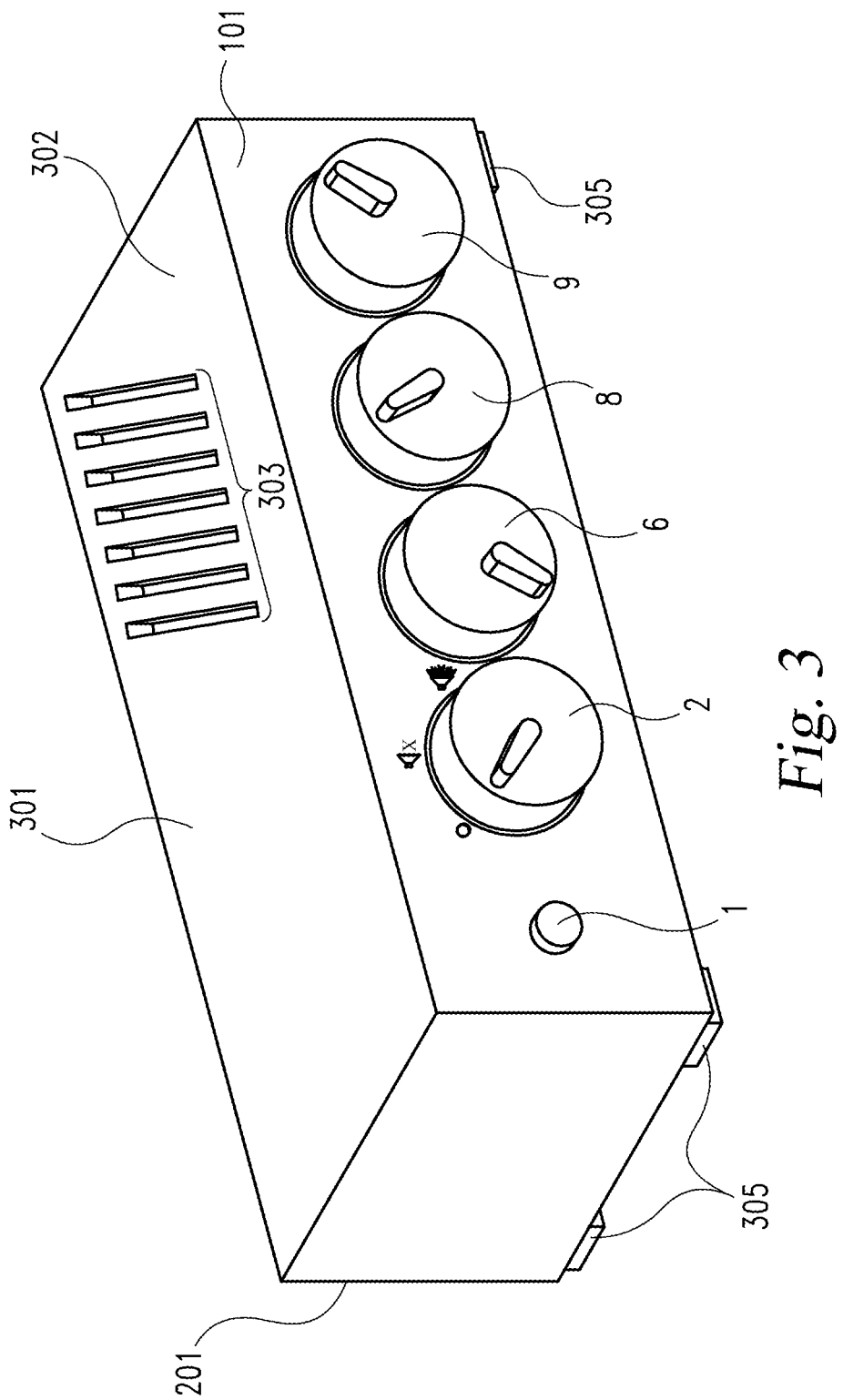
FIG. 3 is a perspective view of a multiple amplification selector device in a first housing configuration.

As seen in FIGS. 3 & 4, panels 102, 202 may be part of or connected to a housing 302. Preferably, housing 302 substantially encloses the processing components discussed above while permitting access to relevant input and output jacks, switches, and controls. The housing 302 is preferably not configured as a sealed container and instead has openings 303 for ventilation and air flow to electronic components as is known in the art. Although the panels 102 and 202 of FIGS. 1-2 show a particular arrangement of the various input and output jacks, switches, and controls, it is understood that these elements can be rearranged or provided on different panels or even other parts of the housing 302 while remaining consistent with the principles of the disclosure herein. In FIG. 3, the housing 302 is configured as a stand-alone device 301 with feet 305 suitable for placement and use on top of a desk, shelf, or other surface such as the top of a speaker cabinet or amplifier head. In FIG. 4, housing 302 is configured for attachment to a standard equipment or server rack. Typically, a rack-mounted device 401 may be provided in an enclosure 302 approximately 3.5" height or two rack units (2U) with front panel 102 approximately 19 inches wide and extending laterally beyond the dimensions of the main body of the device and having suitable mounting holes 405 for fastening to a rack.

Figure 5:
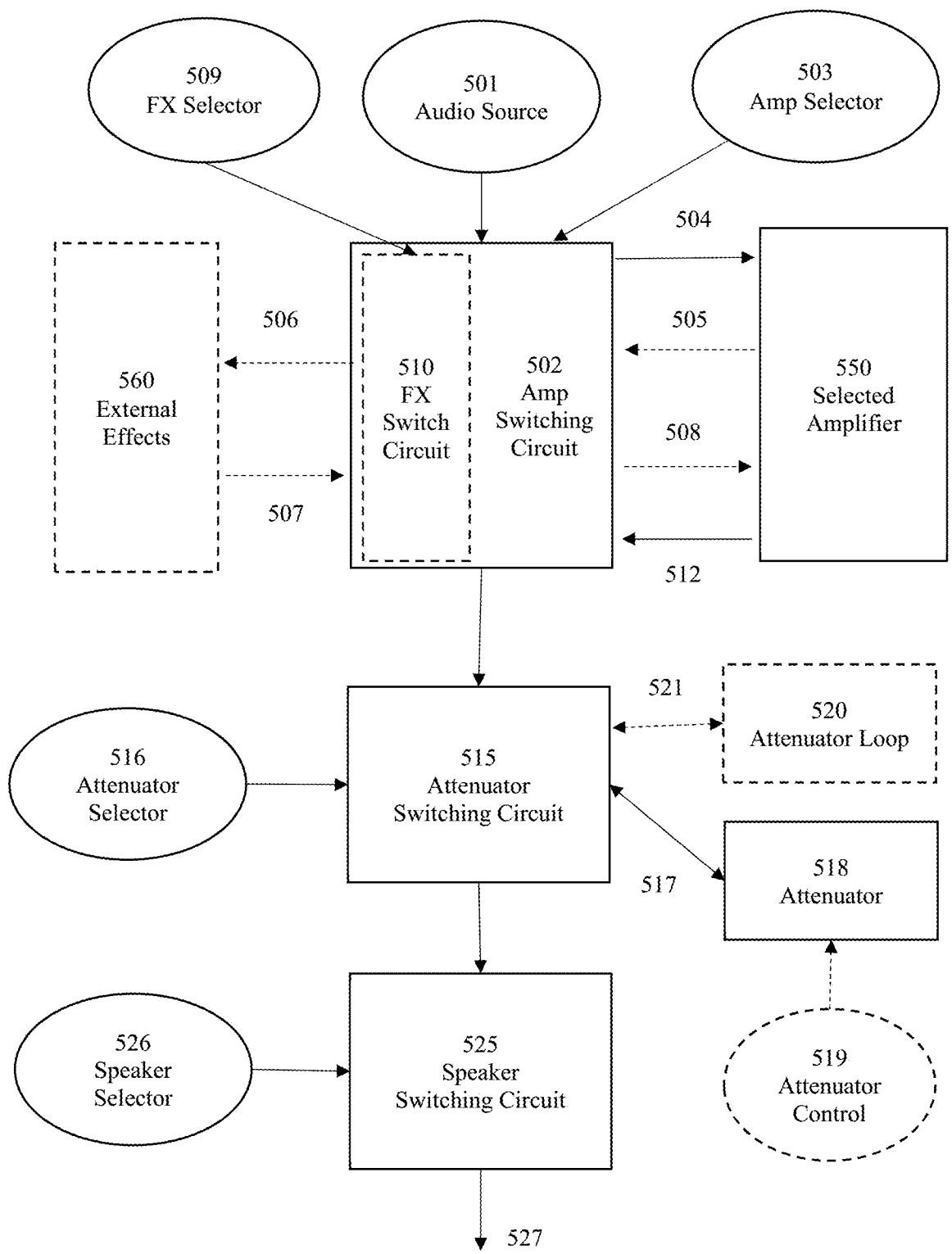
FIG. 5 is a block diagram of signal paths in accordance with multiple amplification selector devices described herein.

In use, a multiple amplifier and speaker selector device can selectively route audio source signals in distinct signal processing pathways as illustrated in FIG. 5. An audio signal source 501 is received through input jack 1 (see FIG. 1) and routed to amplifier switching circuit 502. Circuit 502 routes the original signal through an internal impedance buffer and transformer isolation circuit to a selected amplifier 550 send jack 504 based on the settings of the selector 503. An important feature of the amplifier switching circuit 502 is the isolation and protective load applied to unselected amplifiers. In particular, for each unselected amplifier signal path, the amplifier send jack will be muted and the amplifier return jack will be switched to provide a protective load to prevent damage. In this way, unused amplifiers can be left on when not in use (or not selected) without producing any extraneous noise.

Optionally, external effects processing may be integrated into the signal path. In these embodiments, the effects send of each connected amplifier will be connected to an effects loop input jacks 17 of the device, with a corresponding connection between the device's effects loop output jack 22 to the connected amplifier's effects return. In use, a signal 505 is returned from the selected amplifier's preamp to the device and then routed through the master effects loop 506, 507 before returning to the selected amplifier along path 508. The preamp signal 505 is then routed to master effects send jack 18, through any external effects unit, and returned through master effects return jack 19. External effects units 560 can be of various types known to those of skill in the art; examples include compression effects, delay effects, distortion effects, eq effects, modulation effects, overdrive effects, reverb effects. For each unselected amplifier, the amplifier send and return effects jacks or loops 17 are placed in bypass mode. In effect, the implementation of the master effects loop provides a switchable path such that all external effects units are in use with the selected amplifier but isolated from all unselected amplifiers. Preferably but optionally, effects loop switching circuit 510 is controlled by an effects loop selector 509 to either select or bypass the effects processing pathways.

Amplifier switching circuit 502 receives an amplified signal 512 from a selected amplifier 550 through the selected return jack 14. This signal is then routed to attenuator switching circuit 515 controlled by attenuator selector and/or input 516, which input may direct the level of intensity of the attenuator. When the attenuator selector is engaged rather than bypassed, the amplified signal is routed to either internal attenuator 518 on path 517 or optional external attenuator loop 520 on path 521. Optionally, the level or intensity of the internal attenuation function can be controlled through a separate input 519, for example an input from a dial or potentiometer. Preferably, selection of the external attenuator loop 520 disables the internal attenuator 518. Attenuator switching circuit 515 then receives an attenuated signal from the internal attenuator 518 or the external attenuator loop 520 (if implemented) which is then routed to speaker switching circuit 525. In bypass mode, the attenuator switching circuit 515 simply routes the amplified signal received from the amplifier switching circuit 502 to the speaker switching circuit 525 (subject to any optional effects processing discussed above).

Speaker switching circuit 525 routes the signal to a selected speaker output 527 as determined by input from speaker selector 526. As discussed above, more than one speaker may be selected simultaneously in some implementations. Such implementations may also provide for the selection of only one speaker if desired.

In a preferred embodiment, circuits 502 and 515 produces a reactive load at a specified nominal impedance (for example, 8 ohms at 1 kHz) derived from a combination of resistors and inductors. Thus, the device may provide a first impedance to the selected amplifier return jack independent of a second impedance provided by the selected speaker(s), eliminating audio problems and equipment risks that could be generated by mismatched impedance values if the selected amplifier and selected speaker(s) or cabinet(s) were connected directly. The reactive load impedance may vary with frequency to mimic or model the impedance plot of an actual speaker with a resonant frequency and treble rise. Amplified signal 512 may be split between this reactive load an attenuation network comprising a fixed resistance, rheostat, and speaker. The combination of the reactive load and attenuator network allows the use of 4, 8, or 16 ohms speaker(s) (or still other impedances) while maintaining a consistent impedance to the amplifier throughout the entire sweep of the attenuator's range. For example, the reactive load may maintain approximately 1 ohm above or below an 8 ohm nominal impedance for the amplifier. In some embodiments, nominal impedance may be selected according to a user input from an impedance switch accessible from the exterior of the housing. For example, referring to FIG. 1, switch 7 could alternatively be implemented as an impedance switch, providing for selection between different nominal impedances provided to the selected amplifier return jack. For example, impedance switch may be used to select between 4 ohms, 8 ohms, or 16 ohms nominal impedance. Preferably, speakers and cabinets will have an impedance in the range of one-half to twice the selected nominal impedance, for example a 4 ohms nominal impedance can be implemented with cabinets ranging from 2 to 8 ohms. It is understood that a range of different impedance values may be implemented depending on the amplifiers and speakers that are intended to be operated in conjunction with the selector device 101.

Figure 6:
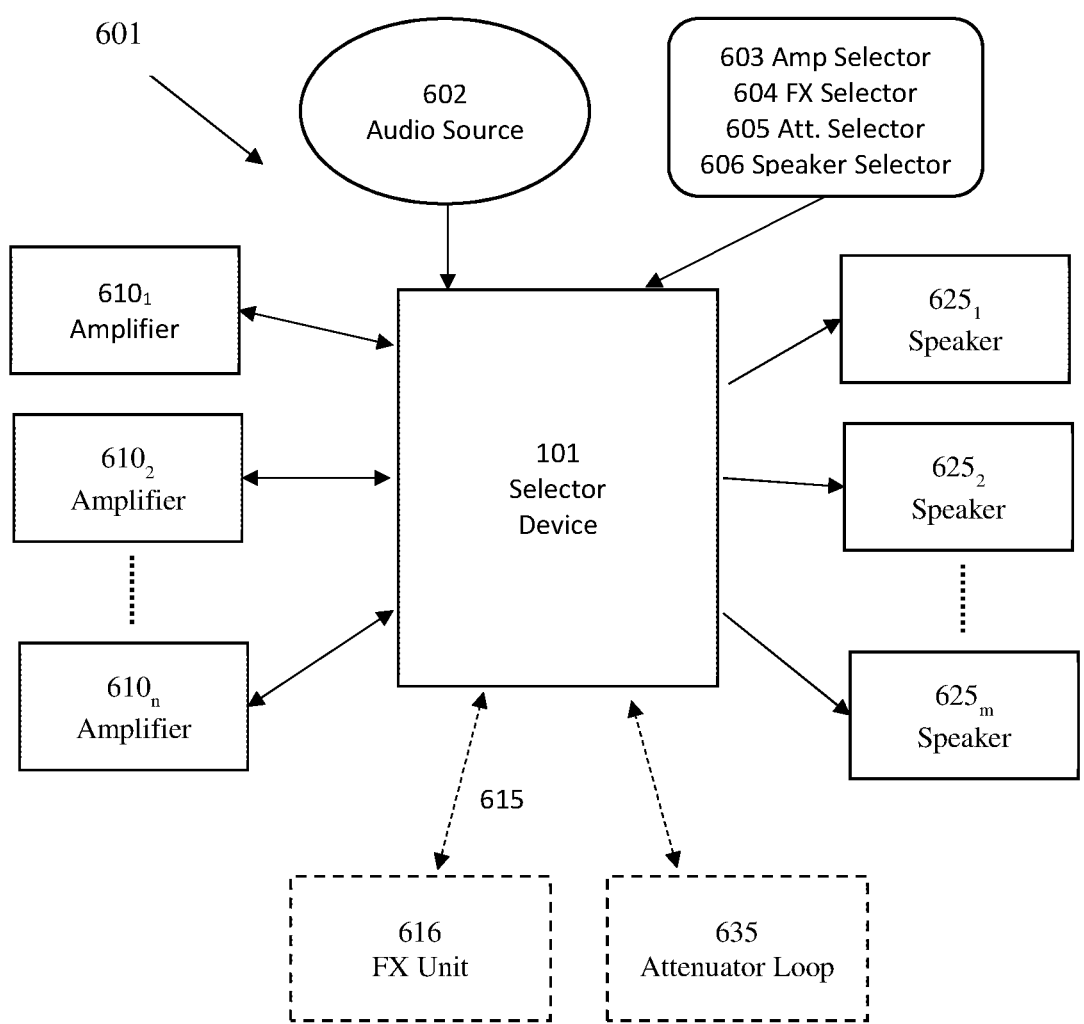
FIG. 6 is a block diagram of a system utilizing a multiple amplification selector device of FIGS. 1-5.

FIG. 6 is a block diagram of a system 601 utilizing a multiple amplification selector device 101 of FIGS. 1-5. The instrument or audio source 602 provides an input signal to the selector device 101. User-controlled inputs include amplifier selector 603, optional effects selector 604, attenuator selector 605, and speaker selector 606. Such selectors may be equipped with ground lift switches to reduce unwanted noise in the signal as previously described. As shown amplifiers $610_1$, $610_2$, . . . $610_n$ may be connected to the device 101 as described previously, with at least two connections (a send and a return) between the device 101 and each amplifier 610. When system 601 include effects loop functionality, two additional connections between each amplifier 610 and the device 101 are provided to connect the signal path of the master effects loop 615 to effects loops of the amplifiers 610 when the effects selector 604 is engaged. External effects loop 615 may be connected to external effects processing units 616 as is known in the art, for example, in the assembly of a guitar pedalboard. Accordingly, effects units 616 may include additional switching apparatus to reconfigure the signal path through units or sub-units within 616. Alternatively, effects units 616 may be in a simple series, and it is additionally within the scope of the disclosure to use a single effects unit 616. However, even if only one effects unit 616 is implemented, it is understood that the unit may be configurable to provide more than one type of audio effect or may provide variable signal processing parameters for a selected effect.

The system 601 includes connections between device 101 and speakers or speaker cabinets $625_1$, $625_2$, . . . , $625_m$. In use, input signal is routed to a selected amplifier $610_i$ based on amplifier selector input 603, and all unselected amplifiers 610 have muted inputs and outputs switched to a protective load. The selected amplifier $610_i$ returns an amplified signal to device 101, subject to any effects applied through signal path of master effects loop 615 when effect selector 604 is engaged as described above. The amplified signal may be attenuated by the internal attenuator (not shown) or an optional external attenuator loop 635 based on attenuator selector input 605 as described previously. Then such attenuated signal is provided to one or more selected speakers or speaker cabinets 625 based on the speaker selector input 606.

While aspects of the invention have been illustrated and described in detail in the drawings and foregoing description, the same is to be considered as illustrative and not restrictive in character, it being understood that only the preferred embodiment has been shown and described and that all changes, equivalents, and modifications that come within the spirit of the inventions defined by following claims are desired to be protected. All publications, patents, and patent applications cited in this specification are herein incorporated by reference as if each individual publication, patent, or patent application were specifically and individually indicated to be incorporated by reference and set forth in its entirety herein.

The invention claimed is:

1. An amplification selector apparatus, comprising:
    an instrument input jack configured to receive an instrument source signal;
    a plurality of amplifier send jacks and a plurality of amplifier return jacks corresponding to the plurality of amplifier send jacks;
    an amplifier selector operably connected to an amplifier switching circuit configured to route the instrument source signal to a selected amplifier send jack, mute unselected amplifier send jacks, and switch unselected amplifier return jacks to a protective load;
    an attenuator selector operably connected to an attenuator switching circuit configured to either select or bypass an internal attenuation device, wherein when selected the internal attenuation device is configured to receive a signal from the selected amplifier return jack and return a first attenuated signal to the attenuator switching circuit;
    a plurality of speaker cabinet send jacks and a speaker selector operably connected to a speaker switching circuit configured to route the signal from the attenuator switching circuit to a selected speaker send jack.

2. The amplification selector apparatus of claim 1, wherein the speaker selector is configured to route the signal from the attenuator switching circuit to two or more selected speaker send jacks.

3. The amplification selector apparatus of claim 1, wherein the plurality of amplifier send jacks comprises at least four amplifier send jacks and the there is an equal number of amplifier return jacks corresponding to the number of amplifier send jacks.

4. The amplification selector apparatus of claim 1, wherein the plurality of speaker cabinet send jacks comprises at least four speaker cabinet send jacks.

5. The amplification selector apparatus of claim 1, further comprising an effects loop selector operably connected to an effects loop switching circuit configured to either select or bypass a set of effects loop send and return jacks, wherein when selected the effects loop switching circuit is configured to receive a first signal from an amplifier effects send jack, route the received first signal to a master effects send jack, receive a second signal from a master effects receive jack, and return the received second signal to an amplifier effects return jack.

6. The amplification selector apparatus of claim 5, further comprising a ground lift switch operable to selectively break a ground connection within the amplification selector apparatus.

7. The amplification selector apparatus of claim 1, further comprising an external attenuator send jack and an external attenuator return jack, wherein the attenuator selector and attenuator switching circuit are configured to either select the internal attenuation device, select the external attenuator send jack, or bypass both the internal attenuation device and the external attenuator send jack, wherein when the external attenuator send jack is selected, the attenuator switching circuit is configured to route the signal from the selected amplifier return jack to the external attenuator send jack and receive a second attenuated signal from the external attenuator return jack.

8. The amplification selector apparatus of claim 1, comprising a housing substantially enclosing the amplifier switching circuit, the attenuator switching circuit, the internal attenuation device, and the speaker switching circuit, wherein the amplifier send jacks, amplifier return jacks, speaker cabinet send jacks, amplifier selector, attenuator selector, and speaker selector are accessible from outside of the housing.

9. The amplification selector apparatus of claim 8, wherein the housing is sized and configured for standard equipment rack mounting.

10. The amplification selector apparatus of claim 1, comprising an adjustable line level control operable to send a reduced output signal to a line out jack in parallel to the signal routed to the selected speaker jack.

11. The amplification selector apparatus of claim 1, wherein the amplifier switching circuit is configured to provide a first impedance to the selected amplifier return jack independent of a second impedance provided by the selected speaker.

12. A method for audio signal processing, comprising:
receiving an instrument input signal into an amplifier switching circuit connected to a plurality of amplifier send jacks and a corresponding plurality of amplifier return jacks;
routing the instrument signal to one of the amplifier send jacks based on a first selection and receiving an amplified signal from the selected amplifier return jack, wherein the amplifier switching circuit is configured to switch unselected amplifier return jacks to a protective load;
routing the amplified signal to an attenuator switching circuit as an attenuator input signal, wherein when activated based on a second selection the attenuator switching circuit routes the attenuator input signal to an attenuation device and receives an attenuated signal as an attenuator output signal, wherein when bypassed the attenuator switching circuit provides the amplified signal as the attenuator output signal;
sending the attenuator output signal to a selected speaker send jack based on a third selection.

13. The method of claim 12, wherein sending the attenuator output signal to a selected speaker send jack comprises sending the attenuator output signal to more than one selected speaker send jack.

14. The method of claim 12, comprising receiving a preamp signal from a selected amplifier effects send jack, sending the preamp signal to a master effects loop send jack, receiving a modified signal from a master effects loop return jack, and sending the modified signal to a selected amplifier effects return jack.

15. The method of claim 14, comprising interrupting a ground loop generated by the master effects loop send jack and the master effects loop return jack.

16. An amplification selector apparatus, comprising:
an instrument input jack configured to receive an instrument source signal;
a plurality of amplifier send jacks and a plurality of amplifier return jacks corresponding to the plurality of amplifier send jacks;
an amplifier selector operably connected to an amplifier switching circuit configured to route the instrument source signal to a selected amplifier send jack, mute unselected amplifier send jacks, and switch unselected amplifier return jacks to a protective load;
an effects loop selector operably connected to an effects loop switching circuit configured to either select or bypass a set of effects loop send and return jacks, wherein when selected the effects loop switching circuit is configured to receive a first signal through an effects loop input jack, route the received first signal to a master effects send jack, receive a second signal from a master effects return jack, and return the received second signal to an effects loop output jack;
an attenuator selector operably connected to an attenuator switching circuit configured to either select or bypass an internal attenuation device, wherein when selected the internal attenuation device is configured to receive a signal from the selected amplifier return jack and return a first attenuated signal to the attenuator switching circuit;
a plurality of speaker cabinet send jacks and a speaker selector operably connected to a speaker switching circuit configured to route a signal from the amplifier switching circuit to a selected speaker send jack;
wherein the amplifier switching circuit is configured to provide a first impedance to the selected amplifier return jack independent of a second impedance provided by the selected speaker send jack.

17. The amplification selector apparatus of claim 16, wherein the first impedance is nominally 8 ohms at 1 KHz.

18. The amplification selector apparatus of claim 16, wherein the first impedance is configured to vary with frequency of the signal received by the amplifier return jack according to a model of the impedance plot of a physical speaker.

19. The amplification selector apparatus of claim 16, wherein the amplifier switching circuit and attenuator switching circuit are configured to provide the first impedance at or near a value independent of the selection and level of the internal attenuation device.

20. The amplification selector apparatus of claim 16, comprising an external attenuator send jack and an external attenuator return jack, wherein the attenuator selector and attenuator switching circuit are configured to either select the internal attenuation device, select the external attenuator send jack, or bypass both the internal attenuation device and the external attenuator send jack, wherein when the external attenuator send jack is selected, the attenuator switching circuit is configured to route the signal from the selected amplifier return jack to the external attenuator send jack and receive a second attenuated signal from the external attenuator return jack.

* * * * *